(12) United States Patent
Ibrahim

(10) Patent No.: US 7,983,617 B2
(45) Date of Patent: Jul. 19, 2011

(54) METHOD AND SYSTEM FOR TRANSMITTING MULTIPLE CHANNELS ON FM BANDS

(75) Inventor: Brima Ibrahim, Aliso Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 907 days.

(21) Appl. No.: 11/936,156

(22) Filed: Nov. 7, 2007

(65) Prior Publication Data

US 2008/0233882 A1    Sep. 25, 2008

Related U.S. Application Data

(60) Provisional application No. 60/895,665, filed on Mar. 19, 2007.

(51) Int. Cl.
  *H04B 1/00*  (2006.01)
  *H04B 1/66*  (2006.01)
(52) U.S. Cl. .............................. 455/42; 455/61; 455/102
(58) Field of Classification Search .................... 455/42, 455/102, 106, 107, 91, 73, 112, 113, 118, 455/205, 61
See application file for complete search history.

(56) References Cited

U.S. PATENT DOCUMENTS

| | | | | |
|---|---|---|---|---|
| 5,457,424 A | * | 10/1995 | McGinn et al. | 329/306 |
| 6,714,765 B1 | * | 3/2004 | Kimppa | 455/76 |
| 7,130,596 B2 | * | 10/2006 | Ramachandran | 455/127.1 |

* cited by examiner

*Primary Examiner* — Sonny Trinh
(74) *Attorney, Agent, or Firm* — McAndrews, Held & Malloy, Ltd.

(57) ABSTRACT

Aspects of a method and system for transmitting multiple channels on FM bands may include generating from one or more baseband signals, a plurality of radio frequency transmission signals each at a different radio frequency, wherein the one or more baseband signals comprise an in-phase signal component and/or a quadrature signal component. Suitable combinations of the one or more baseband signals may be modulated in a radio frequency transmission chain that may comprise intermediate frequency modulation and radio frequency modulation. The suitable combinations of the one or more baseband signals may be weighted sums. The plurality of radio frequency signals may each carry distinct information. One of the plurality of radio frequency signals may be centered at a frequency f1+f2 and another one of said plurality of radio frequency signals may be centered at a frequency f1−f2, where f1 and f2 are frequencies.

18 Claims, 8 Drawing Sheets

METHOD AND SYSTEM FOR TRANSMITTING MULTIPLE CHANNELS ON FM BANDS

CROSS-REFERENCE TO RELATED APPLICATIONS/INCORPORATION BY REFERENCE

This application makes reference to, claims priority to, and claims the benefit of U.S. Provisional Application Ser. No. 60/895,665, filed on Mar. 19, 2007.

The above referenced application is hereby incorporated herein by reference in its entirety.

FIELD OF THE INVENTION

Certain embodiments of the invention relate to signal processing for communication systems. More specifically, certain embodiments of the invention relate to a method and system for transmitting multiple channels on FM bands.

BACKGROUND OF THE INVENTION

Electronic communication has become prolific over the last decade. While electronic communication was initially limited to the desktop, recent trends have been to make communications, media content and the Internet available anytime, anywhere and, increasingly, on any device. Already now, it is quite common to find mobile devices such as cellular phones or Personal Digital Assistants (PDAs) that incorporate a large range of communication technologies and associated software. For example, fully-featured web-browsers, email clients, MP3 players, instant messenger software, and Voice-over-IP may all be found on some recent devices.

In this same spirit of the 'anytime, anywhere' paradigm, there is a drive towards making content stored on portable devices available on a variety of displays and user interfaces. For example, many portable media devices may be enabled to provide a video output signal to a computer monitor or a television to allow display of, for example, digital photographs. For audio content, one possible output format may be a low-power FM transmission signal. Recent changes, for example, in European regulation by CEPT/ETSI to the category of Short Range Devices (SDR) may now permit the use of very low power FM transmitters to transmit in the FM radio broadcast spectrum at powers of around 50 nW. Such devices interfere with and may experience interference from regular FM broadcast radio and it may hence be desirable to enhance coexistence between FM broadcast stations and personal FM microtransmitters.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and/or system for transmitting multiple channels on FM bands, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for transmitting multiple channels on FM bands. Aspects of the invention may comprise generating from one or more baseband signals, a plurality of radio frequency transmission signals each at a different radio frequency, wherein the one or more baseband signals comprise an in-phase signal component and/or a quadrature signal component. Suitable combinations of the one or more baseband signals may be modulated in a radio frequency transmission chain that may comprise intermediate frequency modulation and radio frequency modulation. The suitable combinations of the one or more baseband signals may be weighted sums. The plurality of radio frequency signals may each carry distinct information. One of the plurality of radio frequency signals may be centered at a frequency f1+f2 and another one of said plurality of radio frequency signals may be centered at a frequency f1−f2, where f1 and f2 are frequencies. The frequencies f1 and f2 may correspond to the radio frequency modulation and the intermediate frequency modulation. The plurality of radio frequency transmission signals may be frequency modulated signals. In the radio frequency transmission chain, a plurality of intermediate frequency signal components may be summed and perform the radio frequency modulation on the sum of the plurality of intermediate frequency signal components. In the radio frequency transmission chain, a plurality of radio frequency signal components may be summed to obtain the plurality of radio frequency transmission signals. The suitable combinations of the one or more baseband signals may be up-converted to radio frequency signals.

Figure 1:
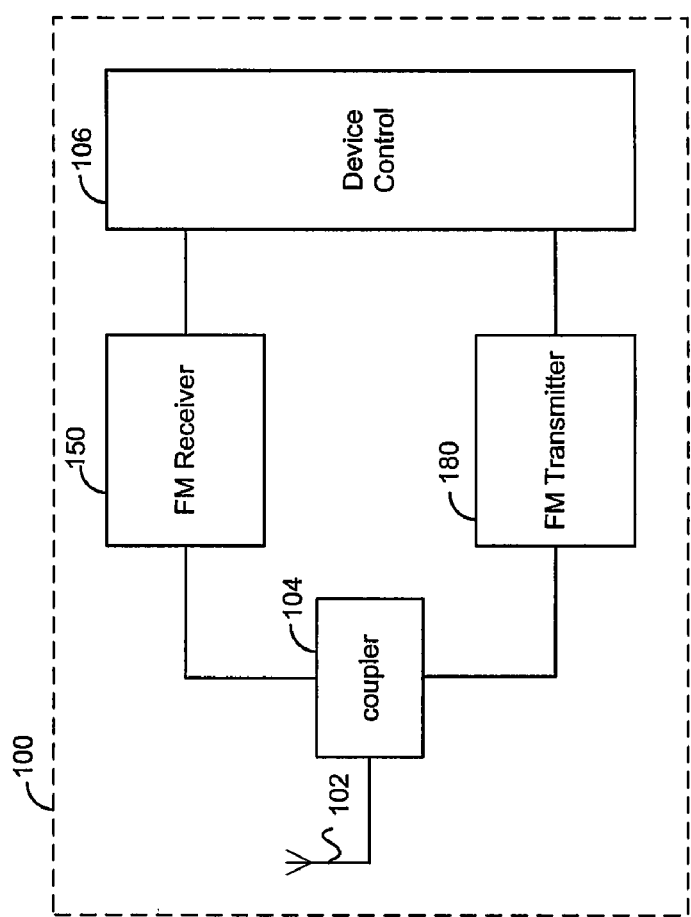
FIG. 1 is a block diagram illustrating an exemplary FM transceiver system, in accordance with an embodiment of the invention.

FIG. 1 is a block diagram illustrating an exemplary FM transceiver system, in accordance with an embodiment of the invention. Referring to FIG. 1, there is shown an FM transceiver system 100 comprising an antenna 102, a coupler 104, an FM receiver 150, an FM transmitter 180 and a device control 106.

The FM transceiver system 100 may comprise suitable logic, circuitry and/or code that may be enabled to transmit and receive FM signals simultaneously on different frequencies and/or in an alternating fashion on the same frequency. The FM transmitter 180 may comprise suitable logic, circuitry and/or code to enable generation of a transmit signal that may be communicated to the coupler 104. The FM receiver 150 may comprise suitable logic, circuitry and/or logic that may enable reception and/or processing of FM signals, fed to it from the coupler 104. The antenna 102 may be a shared antenna for a transmit signal path and a receive signal path. The transmit signal path from the FM transmitter 180 and the receive signal path to the FM receiver 150 may be coupled to the antenna 102 at the coupler 104 that may comprise suitable logic, circuitry and/or code to join the receive signal path and the transmit signal path, in order to communicatively couple a common signal path to antenna 102. A device control block 106 may comprise suitable logic, circuitry and/or code to enable controlling the FM transmitter 180 and the FM receiver 150. The control block 106 may control, for example, a gain and/or a demodulation frequency in the FM receiver 150 and, for example, a transmit power and frequency of the FM transmitter 180. The functionality of the device control block 106 may not be limited to the functionality described above.

In various other embodiments of the invention, the FM transceiver system 100 may not comprise an FM receiver 150; and/or the FM receiver 150 and the FM transmitter 180 may use separate antennas. In various other embodiments of the invention, the FM transceiver system 100 may be a stand-alone system or may form part of a device, for example, a personal audio player or a cellular mobile phone. The invention may not be limited to the examples given above.

Figure 2:
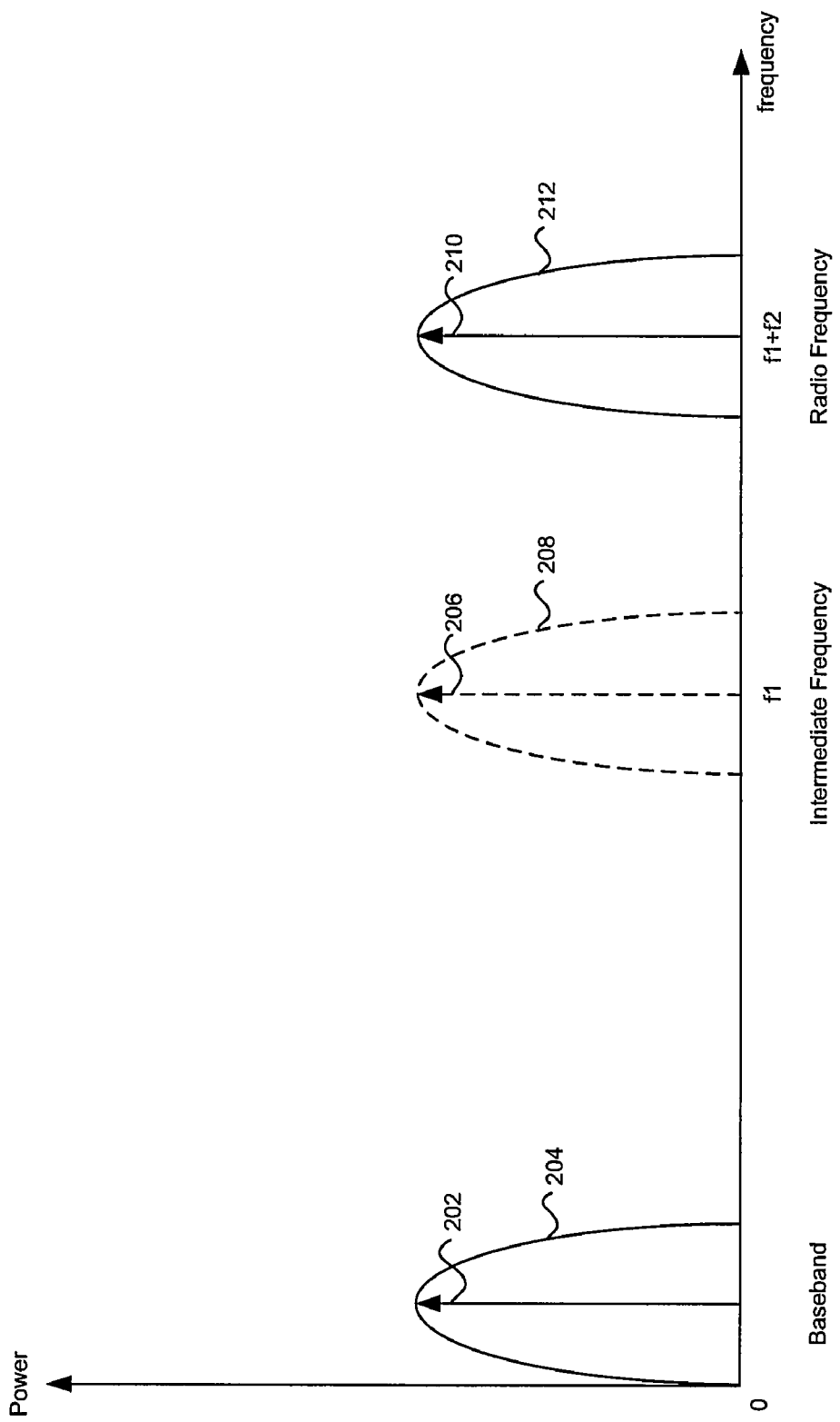
FIG. 2 is a frequency diagram illustrating an exemplary FM transmitter frequency band, in accordance with an embodiment of the invention.

FIG. 2 is a frequency diagram illustrating an exemplary FM transmitter frequency band, in accordance with an embodiment of the invention. Referring to FIG. 2, there is shown a baseband spectrum 204 with a baseband center frequency 202, an intermediate frequency (IF) spectrum 208 with an IF center frequency 206, and a radio frequency (RF) spectrum 212 with an RF center frequency 210.

In many RF systems, a baseband signal may be generated, which may generally comprise low-frequency signal components. Most signal processing may generally take place at low signal frequencies since practical implementation of low-frequency components may be desirable. In the case of an FM transmitter system, the baseband signal may be, for example, an FM-modulated stereo audio signals such as music or speech. The baseband spectrum 204 may depict an exemplary frequency band of a baseband signal. The baseband spectrum 204 may, for example, indicate the signal power as a function of frequency. As depicted in FIG. 2, the baseband signal may typically be band-limited, that is, most of the signal energy may be concentrated in a limited band of frequencies. For example, high quality audio may be concentrated between 20 Hz and 15 kHz or telephone quality voice may be concentrated between 400 Hz and 3400 Hz.

In order to transmit the baseband signal by means of radio signals, the baseband signal may need to be shifted to higher frequencies that may be more amenable to radio transmission. For example, most FM radio stations broadcast at frequencies near 100 MHz. In order to transform a baseband signal to a radio frequency signal, it may be desirable to translate the baseband spectrum 204 to a corresponding radio frequency spectrum 212, where the radio frequency spectrum may be concentrated near a carrier frequency that may be suitable for transmission as a radio signal. In many radio systems, frequency translation of the baseband spectrum 212 to the RF spectrum 212 may be achieved via an intermediate frequency spectrum 208. In some systems, the intermediate frequency spectrum may be at a fixed frequency, whereas the RF frequency for transmission may be variable. In those cases, for example, certain signal processing may occur at the intermediate frequency. One advantage of this may be that the characteristics of the processing blocks at IF may be more narrowband than they may need to be at the higher RF frequencies. In other words, it may be desirable for most components to be tuned to operate over a narrow range of frequencies.

The frequency translation to intermediate frequency and the frequency translation to radio frequency may typically require appropriate filters to reject image frequencies. Image frequencies may in some cases be undesired frequency components that may arise from the modulation process and may be reduced by appropriate filtering.

Figure 3:
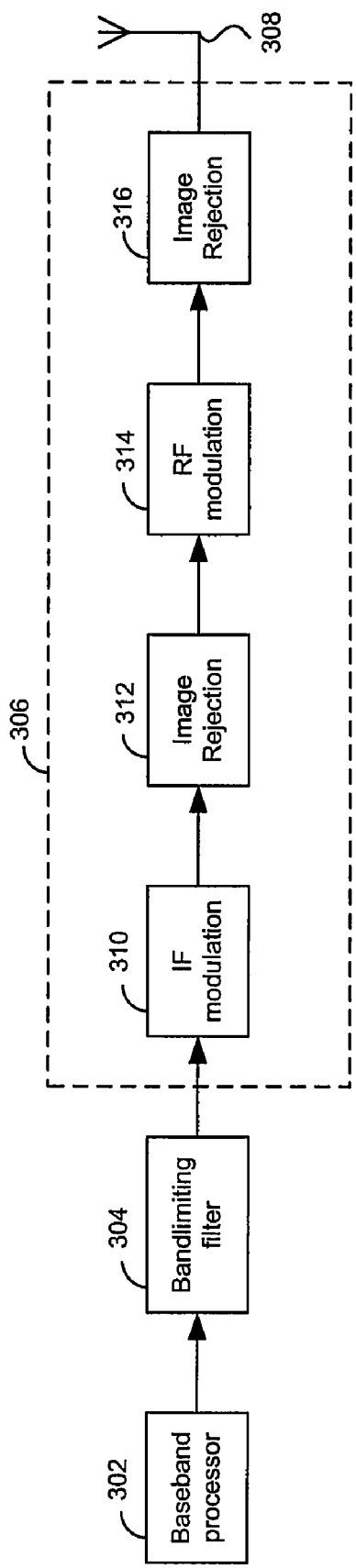
FIG. 3 is a block diagram illustrating an exemplary FM transmitter system, in accordance with an embodiment of the invention.

FIG. 3 is a block diagram illustrating an exemplary FM transmitter system, in accordance with an embodiment of the invention. Referring to FIG. 3, there is shown a baseband processor 302, a band-limiting filter 304, an RF transmitter chain 306 and an antenna 308. The RF transmitter chain 306 may comprise an IF modulation block 310, image rejection blocks 312 and 316, and RF modulation block 314. The baseband processor 302 may comprise suitable logic, circuitry and/or code that may be enabled to generate a baseband signal, which may comprise an in-phase and/or a quadrature component. The baseband signal generated in the baseband processor 302 may be communicatively coupled to the band-limiting filter 304. The baseband processor 302 and the band-limiting filter 304 may generate a signal spectrum similar to, for example, the baseband spectrum 204 shown in FIG. 2. The filtered baseband signal may be modulated to intermediate frequency (IF) in the IF modulation block 310. The image rejection block 312 may comprise suitable logic, circuitry and/or code that may be enabled to reduce undesirable IF signal components. The output signal of the image rejection block 312 may be coupled to the RF modulation block 314. The RF modulation block 314 may comprise suitable logic, circuitry and/or code that may be enabled to modulate the filtered IF signal to radio frequency. The image rejection block 316 may comprise suitable logic, circuitry and/or code that may be enabled to reduce undesired RF frequency components. The output signal of the RF transmitter chain 306 may be communicatively fed to the antenna 308, where the RF signal may be transmitted from.

Some FM radio transmitters may transmit Radio Data System (RDS) or Radio Broadcast Data System (RBDS) with the audio signal in, for example, Europe and the USA, respectively. RDS/RBDS may be used to send certain data embedded in an FM radio broadcast. For example, RDS/RBDS may comprise a transmit station identifier (PI) and alternate frequencies (AF identifier). Based on the station identifier and alternate frequency information, the FM radio receiver may switch to a better reception quality frequency without interrupting the reception for the listener. In this regard, a traveling car, for example, may seamlessly switch from radio transmitter to radio transmitter that may provide good and uninterrupted reception quality to the listener as the vehicle travels through the coverage area of various radio transmitters.

Hence, by including suitable RDS/RBDS signals, for example, a baseband signal generated in the baseband processor 302 may comprise information that may enable a suitable FM receiver to automatically change to the best quality reception frequency.

In the case of a portable, low-power FM transmitter that may be used, for example, to broadcast audio from a personal audio player for reception by an FM receiver inside a vehicle, it may be possible to broadcast the audio on multiple channels that may be switched automatically based on suitable RDS/RBDS information comprised in the baseband signal (and hence, the RF signal). In some instances, it may be desirable for an FM transmitter to transmit multiple channels of different content. For example, it may be desirable to broadcast different streams for different listeners using, for example, portable audio players capable of receiving FM broadcasts.

Typically, a generated RF bandpass signal for transmission over an antenna may be similar to s'(t), given by the following relationship:

$$s'(t) = s_I(t)\cos(w_1 t) + s_Q(t)\sin(w_1 t)$$

where $s_I(t)$ may be the in-phase baseband component and $s_Q(t)$ may be a quadrature baseband component and $w_1 = 2\pi f_1$ may be the angular frequency that may define the carrier frequency at radio frequency. In accordance with an embodiment of the invention, an FM transmitter may desire to transmit multiple channels at several different frequencies, so that the FM receiver may switch between the at least two channels, based on which broadcast may be desired. In this case, the desired transmitted signal may be similar to s(t), given by the following relationship for two channels at different frequencies:

$$s(t) = s_{I1}(t)\cos(w_1 t) + s_{Q1}(t)\sin(w_1 t) + s_{I2}(t)\cos(w_2 t) + s_{Q2}(t)\sin(w_2 t) \quad (1)$$

where baseband signals $s_{I1}(t)$ and $s_{Q1}(t)$, and $s_{I2}(t)$ and $s_{Q2}(t)$ may be transmitted on angular frequencies $w_1$ and $w_2$, respectively. In some instances, $sI1(t) = sI2(t)$ and $sQ1(t) = sQ2(t)$, so that the two transmit channels depicted in equation (1) may be the same. Such a transmission signal may be generated, in accordance with an embodiment of the invention.

Equation (1) may be rewritten by defining $w_1 = w_a + w_b$ and $w_2 = w_a - w_b$ as given by the following relationship:

$$\begin{aligned} s(t) &= s_{I1}(t)\cos(w_1 t) + s_{Q1}(t)\sin(w_1 t) + s_{I2}(t)\cos(w_2 t) + \\ &\quad s_{Q2}(t)\sin(w_2 t) \\ &= x_I(t)\cos(w_a t) + a_Q(t)\sin(w_a t) \\ x_I(t) &= (s_{I1}(t) + s_{I2}(t))\cos(w_b t) + (s_{Q1}(t) + s_{Q2}(t))\sin(w_b t) \\ x_Q(t) &= (s_{Q1}(t) + s_{Q2}(t))\cos(w_b t) + (s_{I2}(t) - s_{I1}(t))\sin(w_b t) \end{aligned} \quad (2)$$

Based on equation (2), the desired signal s(t) may written in the form of a bandpass signal, as may be seen from line 2 of equation (2), whereby the in-phase signal $x_I(t)$ and the quadrature signal $s_Q(t)$ may be themselves bandpass signals. As illustrated in equation (2), the signals $x_I(t)$ and $x_Q(t)$ may be generated from modulating suitable sums of the baseband signal components $s_{I1}(t)$, $s_{I2}(t)$, $s_{Q1}(t)$ and $s_{Q2}(t)$ onto an in-phase carrier $\cos(w_a t)$ and a quadrature carrier $\sin(w_a t)$. In accordance with various embodiments of the invention, an image frequency rejection may not be desirable in this instance, as illustrated in equation (2). The exemplary embodiment of the invention illustrated above may be used to generate more than two bandpass channels as illustrated above. For example, $N = 2^{K-1}$ different channels may be generated from K different frequencies. It may be observed that, for example, the generated channel may be generated at frequencies given by the set $\{w_1 \pm w_2 \pm \ldots \pm w_K\}$. The amplitude of each channel may be adjusted independently from the other channels by appropriately adjusting the amplitude to the base signals $s_{I1}(t)$, $s_{I2}(t)$, $s_{Q1}(t)$ and $s_{Q2}(t)$.

Figure 4A:
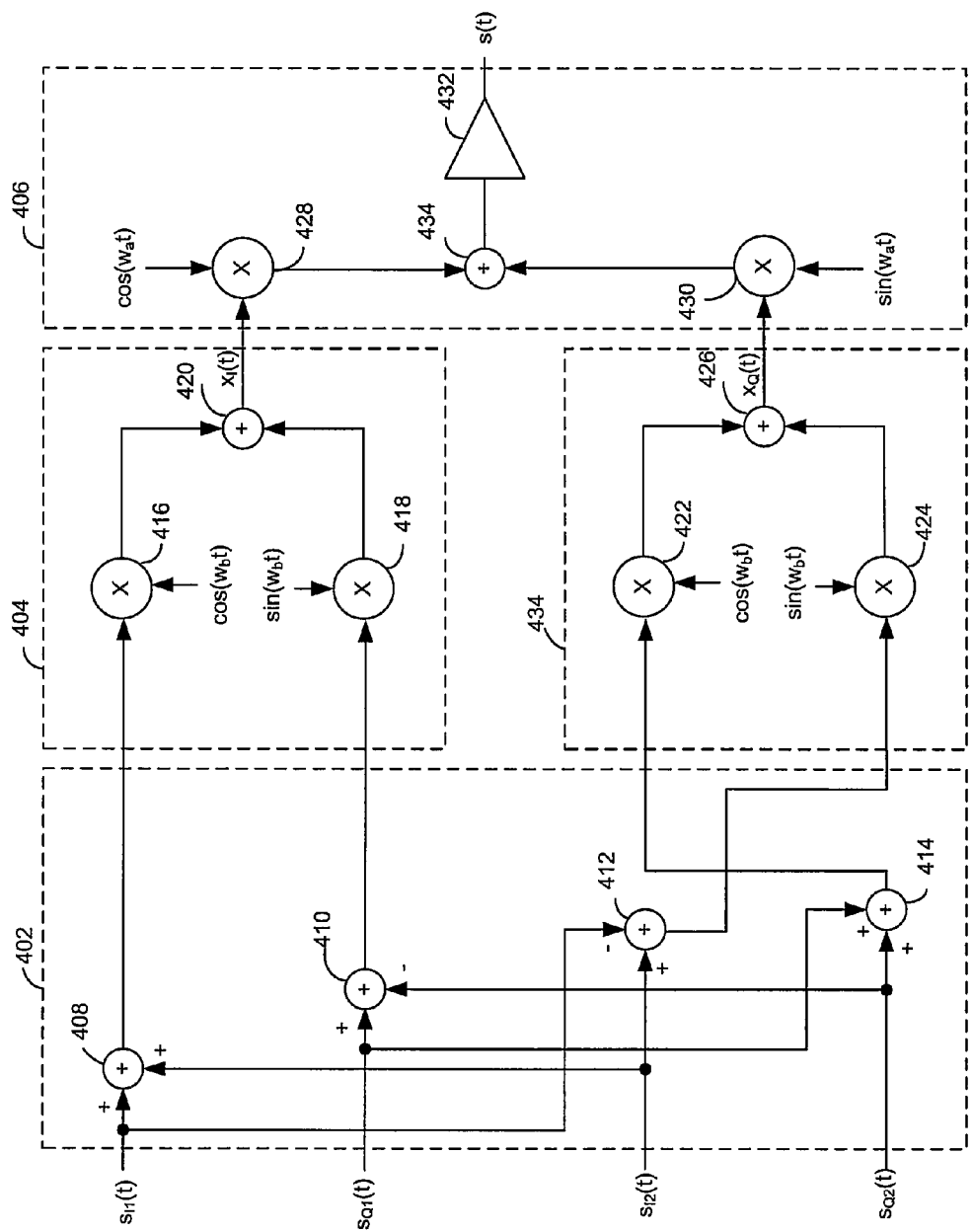
FIG. 4A is a circuit diagram illustrating an exemplary embodiment of a dual channel FM transmitter, in accordance with an embodiment of the invention.

FIG. 4A is a circuit diagram illustrating an exemplary embodiment of a dual channel FM transmitter, in accordance with an embodiment of the invention. Referring to FIG. 4A, there is shown a baseband mixer 402, RF mixers 404, 406 and 434. The baseband mixer may comprise adders 408, 410, 412 and 414. The RF mixer 404 may comprise multipliers 416 and 418 and adder 420. The RF mixer 434 may comprise multipliers 422, 424 and adder 426. The RF mixer 406 may comprise multipliers 428 and 430, adder 434 and amplifier 432. The RF mixers 404, 434 and 406 may be substantially similar and may comprise suitable logic, circuitry and/or code that may be enabled to accept an in-phase input signal and a quadrature input signal and modulate them onto a carrier signal, respectively. The baseband mixer 402 may comprise suitable logic, circuitry and/or code that may be enabled to generate output signals that may be suitable sums of a plurality of input signals. There is also shown baseband inputs $s_{I1}(t)$, $s_{I2}(t)$, $s_{Q1}(t)$ and $s_{Q2}(t)$, carrier signals $\cos(w_b t)$, $\cos(w_a t)$, $\sin(w_a t)$, $\sin(w_b t)$ and $x_I(t)$ and $x_Q(t)$, as described in FIG. 2.

In accordance with an embodiment of the invention, FIG. 4A may illustrate a circuit implementation of equation (2). The baseband mixer 402 may generate the various combinations of baseband input signals $s_{I1}(t)$, $s_{I2}(t)$, $s_{Q1}(t)$ and $s_{Q2}(t)$, which may be modulated in the RF mixers 404 and 434. In particular, RF mixer 404 may generate $x_I(t)$, in accordance with equation (2). Similarly, RF mixer 434 may generate $x_Q(t)$, in accordance with equation (2). The outputs of the RF mixers 404 and 434 may be communicatively coupled to RF mixer 406, which may generate s(t). In accordance with FIG. 4A, the RF mixers 404 and 434 may also be referred to as an intermediate frequency modulator and the RF mixer 406 may be referred to as the radio frequency modulator.

Figure 4B:
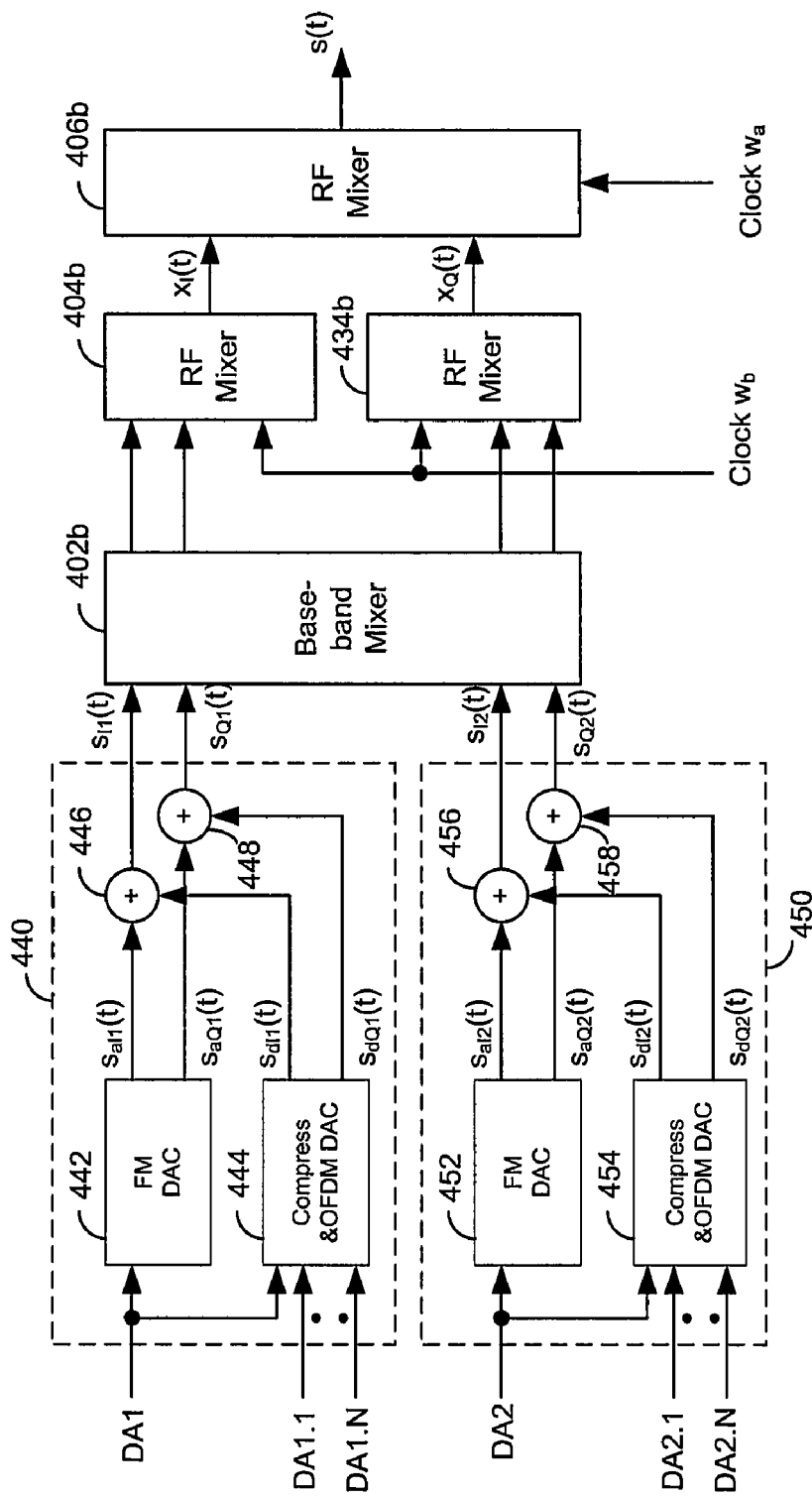
FIG. 4B is a block diagram of an exemplary Hybrid Analog/Digital (HD) FM transmitter, in accordance with an embodiment of the invention.

FIG. 4B is a block diagram of an exemplary Hybrid Analog/Digital (HD) FM transmitter, in accordance with an embodiment of the invention. Referring to FIG. 4B, there is shown a first channel processor 440, a second channel processor 450, a baseband mixer 402b and RF mixers 404b, 434b and 406b. The first channel processor 440 may comprise a FM DAC 442, a compress OFDM DAC 444 and adders 446 and 448. Similarly, the second channel processor 450 may comprise a FM DAC 452, a compress OFDM DAC 454 and adders 456 and 458 There is also shown a digital audio input DA1, a plurality of digital audio inputs DA1.1 through DA1.N, a digital audio input DA2, a plurality of digital audio inputs DA2.1 through DA2.N, baseband signals $s_{aI}1(t)$, $s_{aQ1}(1)$, $s_{dI1}(t)$, $s_{dQ1}(t)$, $s_{aI2}(t)$, $s_{aQ2}(t)$, $s_{dI2}(t)$, and $s_{dQ2}(t)$ baseband signals $s_{I1}(t)$, $s_{Q1}(t)$, $s_{I2}(t)$, and $s_{Q2}(t)$, intermediate frequency signals $x_I(t)$ and $x_Q(t)$ and RF signal s(t).

The baseband mixer 402b and the RF mixers 404b, 434b and 406b may be substantially similar to the corresponding elements in FIG. 4A, baseband mixer 402 and the RF mixers 404, 434 and 406, respectively. The baseband processors 440 and 450 may be substantially similar and may comprise suitable, logic, circuitry and/or code that may be enabled to convert a plurality of digital audio stream to a hybrid analog FM signal comprising an in-phase and a quadrature component. For example, the baseband processor 440 may be coupled to digital audio input DA1 using, for example, a PCM format. The input DA1 may in some cases also be an analog signal. The digital audio signal DA1 may be encoded by both the FM DAC 442 and the compress OFDM DAC. The digital audio signals DA1.1 through DA1.N may be encoded digitally in the compress OFDM DAC 444. Similarly, the digital audio signal DA2 may be encoded by the FM DAC 452 and the compress OFDM DAC 454, and the digital audio signals DA2.1 through DA2.N may be encoded digitally in the compress OFDM DAC 454. The digital audio signals DA1 and DA2 may hence be hybrid encoded. The digital audio signals DA1.1 through DA1.N and the digital audio signals DA2.1 through DA2.N may be encoded HD digitally.

The digital audio signal DA1, for example, may then be communicatively coupled to the input of the FM DAC 442. The FM DAC 442 may comprise suitable circuitry, logic and/or code that may be enabled to convert the input signal to an analog frequency-modulated (FM) signal comprising of an in-phase baseband signal $s_{aI}(t)$ and a quadrature baseband signal $s_{aQ1}(t)$. The output signals of the FM DAC 442 may in some instances conform to standard FM broadcast formats. The digital audio input DA1 may also be communicatively coupled to the Compress OFDM DAC 444. The compress OFDM DAC 444 may comprise suitable circuitry, logic and/or code that may be enabled to generate an analog OFDM modulated output signal that may be used for Hybrid Analog/Digital (HD) FM broadcasts, for example. The output of the compress OFDM DAC 444 may comprise an in-phase output $s_{dI1}(t)$ and a quadrature output $s_{dQ1}(t)$. The compress OFDM DA 444 converter may convert the plurality of digital audio inputs DA1, and DA1.1 through DA1.N, for example, by first compressing the audio digitally, OFDM modulate it and finally convert it to an analog signal. The in-phase outputs and the quadrature outputs of the FM DAC 442 and the compress OFDM DAC 442 may be summed in the adders 446 and 448, respectively to give the input signals to the baseband mixer 402*b*, so that:

$$s_{I1}(t)=s_{aI1}(t)+s_{dI1}(t)$$

$$s_{Q1}(t)=s_{aQ1}(t)+s_{dQ1}(t)$$

The second channel processor 450 may be substantially similar and may generate an in-phase and a quadrature output signal similar to the first channel processor 440 for the digital audio input DA2, and DA2.1 through DA2.N, given by the following relationship:

$$s_{I2}(t)=s_{aI2}(t)+s_{dI2}(t)$$

$$s_{Q2}(t)=s_{aQ2}(t)+s_{dQ2}(t)$$

The baseband in-phase and quadrature components may be communicatively coupled to the baseband mixer 402*b*, where suitable summing of the input signals may occur in order to generate the output signals of the base band mixer 402*b*, as described for FIG. 4A. As described in FIG. 4, the RF mixers 404*b* and 434*b* may generate an intermediate frequency signal, comprising an in-phase component $x_I(t)$ and a quadrature component $x_Q(t)$. In the RF mixer 406*b*, the outputs from the RF mixers 404*b* and 434*b* may be upconverted and summed to generate an output signal s(t), as described for FIG. 4A. This signal, in accordance with various embodiments of the invention, may comprise a plurality of radio channels, which may be HD FM channels, for example, as illustrated in FIG. 4B.

Figure 4C:
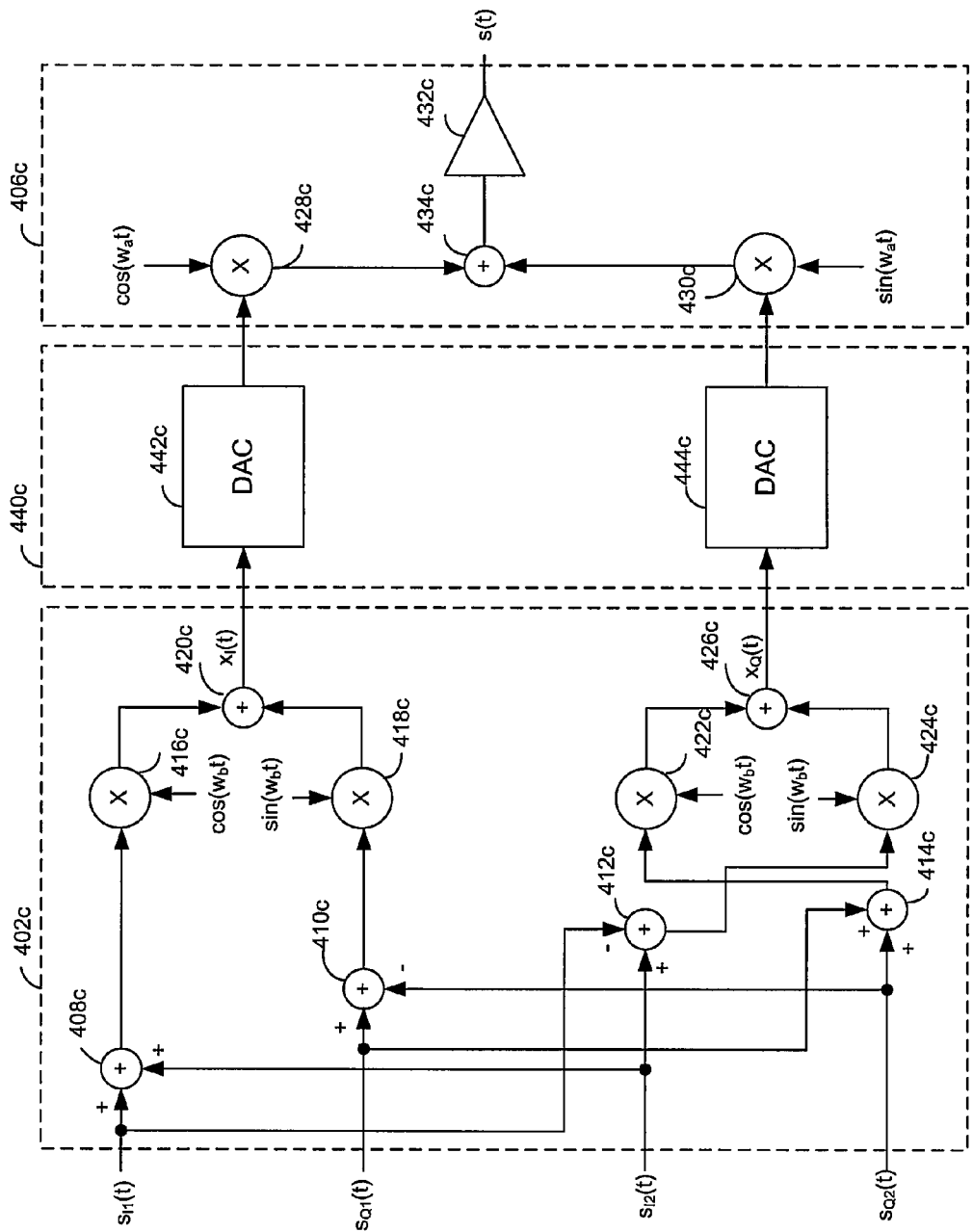
FIG. 4C is a circuit diagram illustrating an exemplary embodiment of a dual channel FM transmitter using digital IF modulation, in accordance with an embodiment of the invention.

FIG. 4C is a circuit diagram illustrating an exemplary embodiment of a dual channel FM transmitter using digital IF modulation, in accordance with an embodiment of the invention. Referring to FIG. 4C, there is shown a baseband mixer 402*c*, a Digital-to-Analog (DAC) block 440*c*, and an RF mixer block 406*c*. The baseband mixer 402*c* may comprise adders 408*c*, 410*c*, 412*c* and 414*c*, multipliers 416*c*, 418*c*, 422*c* and 424*c*, and adders 420*c* and 426*c*. The DAC block 440*c* may comprise a DAC 442*c* and a DAC 444*c*. The DAC 442*c* and the DAC 444*c* may be substantially similar and may comprise suitable logic, circuitry and/or code that may be enabled to accept an digital in-phase input signal and a digital quadrature input signal and convert them to an analog output signal suitable for RF modulation in the RF mixer block 406*c*. The baseband mixer 402*c* may comprise suitable logic, circuitry and/or code that may be enabled to generate digital output signals that may be suitable sums of a plurality of digital input signals that may be modulated digitally to intermediate frequency. There is also shown digital baseband inputs $s_{I1}(t)$, $s_{I2}(t)$, $s_{Q1}(t)$ and $s_{Q2}(t)$, digital carrier signals $\cos(w_b t)$, $\cos(w_a t)$, $\sin(w_a t)$, $\sin(w_b t)$ and $x_I(t)$ and $x_Q(t)$.

In accordance with an embodiment of the invention, FIG. 4C may illustrate a digital implementation of equation (2). The baseband mixer 402*c* may generate the various combinations of baseband input signals $s_{I1}(t)$, $s_{I2}(t)$, $s_{Q1}(t)$ and $s_{Q2}(t)$, which may be modulated to intermediate frequency by the multipliers 416*c*, 418*c*, 422*c* and 424*c*. The operations in baseband mixer 402*c* may be digital, and may generate digital output signals $x_I(t)$ and $x_Q(t)$, in accordance with equation (2). The digital IF modulated outputs of the baseband mixer 402*c* may be communicatively coupled to the DAC block 440*c*, which may generate analog signals suitable for RF modulation. The output signals of the DAC 442*c* and the DAC 444*c* may be communicatively coupled to the RF mixer 406*c*, where the signals may be modulated to radio frequency and combined to generate s(t).

Figure 4D:
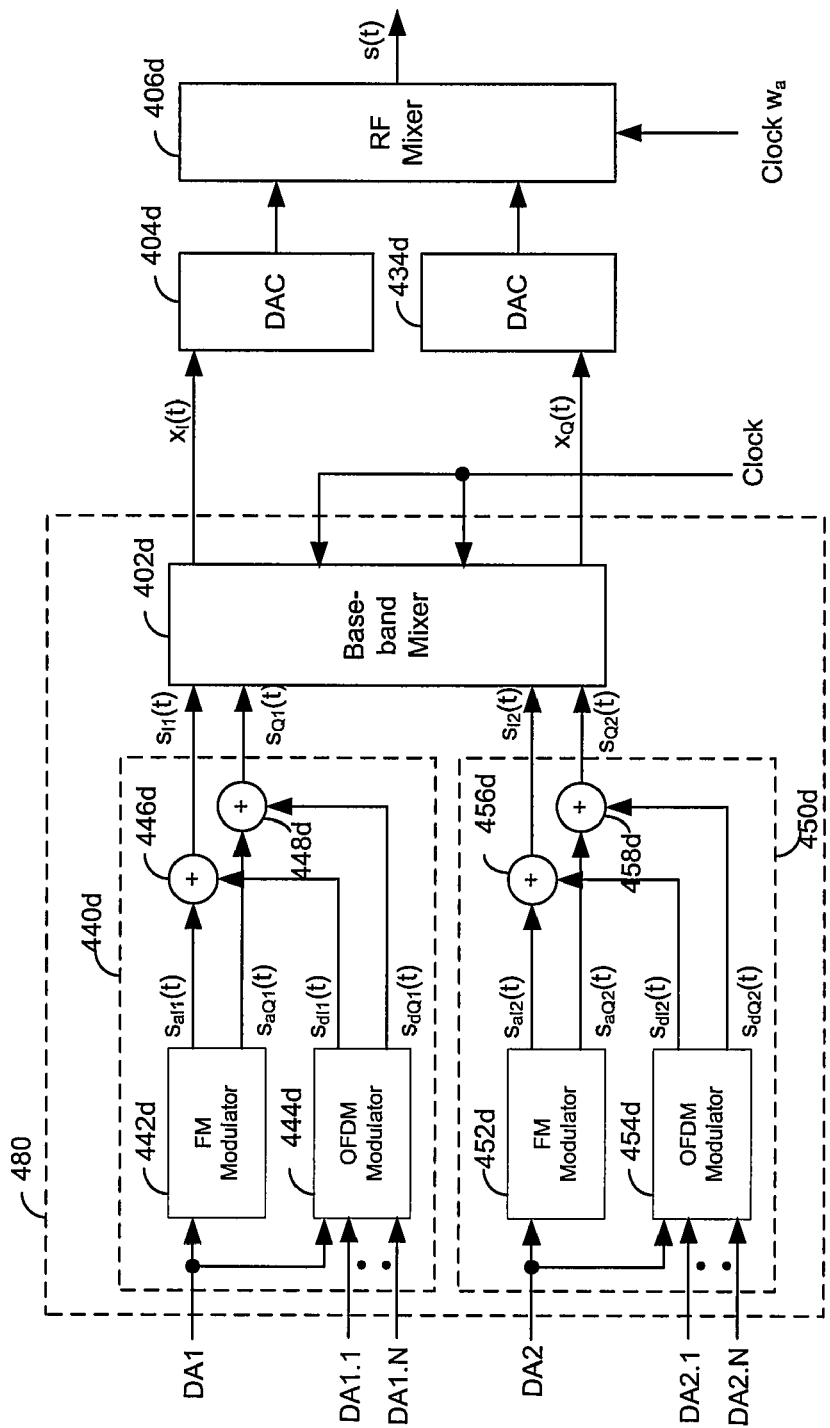
FIG. 4D is a block diagram of an exemplary Hybrid Analog/Digital (HD) FM transmitter using digital IF modulation, in accordance with an embodiment of the invention.

FIG. 4D is a block diagram of an exemplary Hybrid Analog/Digital (HD) FM transmitter using digital IF modulation, in accordance with an embodiment of the invention. Referring to FIG. 4D, there is shown a digital processor 480, digital-to-analog converters (DACs) 404*d* and 434*d*, and RF mixer 406*d*. The digital processor 480 may comprise a first channel processor 440*d*, a second channel processor 450*d* and a baseband mixer 402*d*. The first channel processor 440*d* may comprise an FM modulator 442*d*, an OFDM modulator 444*d* and adders 446*d* and 448*d*. Similarly, the second channel processor 450*d* may comprise an FM modulator 452*d*, an OFDM modulator 454*d* and adders 456*d* and 458*d* There is also shown a digital audio input DA1, a plurality of digital audio inputs DA1.1 through DA1.N, a digital audio input DA2, a plurality of digital audio inputs DA2.1 through DA2.N, baseband signals $s_{aI}(t)$, $s_{aQ1}(1)$, $s_{dI1}(t)$, $s_{dQ1}(t)$, $s_{aI2}(t)$, $s_{aQ2}(t)$, $s_{dI2}(t)$, and $s_{dQ2}(t)$ baseband signals $s_{I1}(t)$, $s_{Q1}(t)$, $s_{I2}(t)$, and $s_{Q2}(t)$, intermediate frequency signals $x_I(t)$ and $x_Q(t)$ and RF signal s(t).

The digital processor functionality 480 may be substantially similar, but digitally implemented, to the functionality of the first channel processor 440, second channel processor 450, baseband mixer 402*b*, and RF mixers 404*b* and 434*b* illustrated in FIG. 4B. The baseband mixer 402*d* and the DACs 404*d* and 434*d* may be substantially similar to the corresponding elements in FIG. 4C, baseband mixer 402*c* and DACs 442*c* and 444*c*, respectively. The baseband first channel processors 440*d* and 450*d* may be similar and may comprise suitable, logic, circuitry and/or code that may be enabled to convert a plurality of digital audio stream to a hybrid digital FM signal comprising an in-phase and a quadrature component. For example, the baseband processor 440*d* may be coupled to digital audio input DA1 using, for example, a PCM format. The digital audio signal DA1 may be encoded by both the FM modulator 442*d* and the OFDM modulator 444*d*. The digital audio signals DA1.1 through DA1.N may be encoded digitally in the OFDM modulator 444*d*. Similarly, the digital audio signal DA2 may be encoded by the FM modulator 452*d* and the OFDM modulator 454*d*, and the digital audio signals DA2.1 through DA2.N may be encoded digitally in the OFDM modulator 454*d*. The digital audio signals DA1 and DA2 may hence be hybrid encoded.

The digital audio signals DA1.1 through DA1.N and the digital audio signals DA2.1 through DA2.N may be encoded HD digitally.

The digital audio signal DA1, for example, may be communicatively coupled to the input of the FM modulator 442$d$. The FM modulator 442$d$ may comprise suitable circuitry, logic and/or code that may be enabled to convert the input signal to a digital frequency-modulated (FM) signal comprising of an in-phase baseband signal $s_{aI1}(t)$ and a quadrature baseband signal $s_{aQ1}(t)$. The output signals of the FM modulator 442$d$ may in some instances conform to standard FM broadcast formats. The digital audio input DA1 may also be communicatively coupled to the OFDM modulator 444$d$. The OFDM modulator 444$d$ may comprise suitable circuitry, logic and/or code that may be enabled to generate a digital OFDM modulated output signal that may be used for Hybrid Analog/Digital (HD) FM broadcasts, for example. The output of the OFDM modulator 444$d$ may comprise an in-phase output $s_{dI1}(t)$ and a quadrature output $s_{dQ1}(t)$. The OFDM modulator 444$d$ may convert the plurality of digital audio inputs DA1, and DA1.1 through DA1.N, for example, by first compressing the audio digitally, and OFDM modulate it. The in-phase outputs and the quadrature outputs of the FM modulator 442$d$ and the OFDM modulator 442$d$ may be summed in the adders 446$d$ and 448$d$, respectively to give the input signals to the baseband mixer 402$d$, so that:

$$s_{I1}(t)=s_{aI1}(t)+s_{dI1}(t)$$

$$s_{Q1}(t)=s_{aQ1}(t)+s_{dQ1}(t)$$

The second channel processor 450$d$ may be substantially similar and may generate an in-phase and a quadrature output signal similar to the first channel processor 440$d$ for the digital audio input DA2, and DA2.1 through DA2.N, given by the following relationship:

$$s_{I2}(t)=s_{aI2}(t)+s_{dI2}(t)$$

$$s_{Q2}(t)=s_{aQ2}(t)+s_{dQ2}(t)$$

The baseband in-phase and quadrature components may be communicatively coupled to the baseband mixer 402$d$, where suitable summing of the input signals may occur in order to generate the output signals of the baseband mixer 402$d$, as described for FIG. 4C. As described in FIG. 4C, the DAC 404$d$ and 434$d$ may convert a digital intermediate frequency signal, comprising an in-phase component $x_I(t)$ and a quadrature component $x_Q(t)$, to an analog signal suitable for RF modulation in the RF mixer 406$d$. In the RF mixer 406$d$, the outputs from the DACs 404$c$ and 434$d$ may be upconverted and summed to generate an output signal s(t), as described for FIG. 4C. This signal, in accordance with various embodiments of the invention, may comprise a plurality of radio channels, which may be HD FM channels, for example, as illustrated in FIG. 4D.

Figure 5:
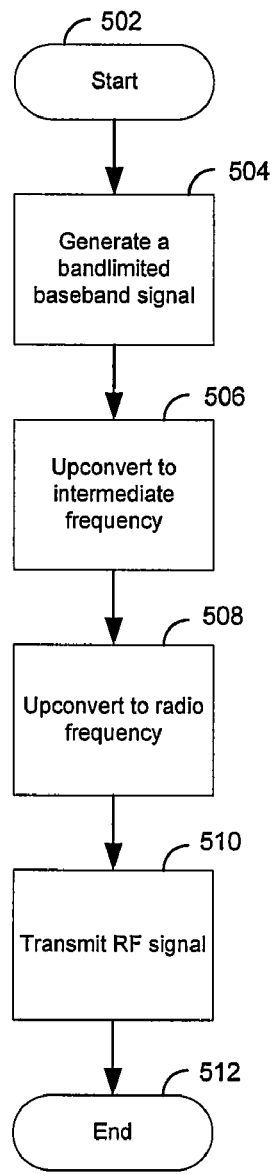
FIG. 5 is a flow chart illustrating an exemplary FM transmission process, in accordance with an embodiment of the invention.

FIG. 5 is a flow chart illustrating an exemplary FM transmission process, in accordance with an embodiment of the invention. The FM transmission process may initially start by generating a plurality of band-limited baseband signal in step 504, for example $s_{I1}(t)$, $s_{I2}(t)$, $s_{Q1}(t)$ and $s_{Q2}(t)$. The band-limited baseband signals may comprise in-phase and/or quadrature signal components. The band-limited baseband signals that may be generated in step 504 may be upconverted to intermediate frequency in step 506. This may be achieved through modulation onto, for example, a carrier at frequency $w_b$ of appropriate sums of the baseband signals. In various embodiments of the invention, the upconversion to radio frequency in step 508 may be achieved by upconverting intermediate frequency signal components. In step 510, the RF signal may then be transmitted, for example, over an antenna similar to antenna 308, illustrated in FIG. 3.

In accordance with an embodiment of the invention, a method and system for transmitting multiple channels on FM bands may comprise generating from one or more baseband signals, a plurality of radio frequency transmission signals each at a different radio frequency, as shown for s(t) in FIG. 3, wherein the one or more baseband signals comprise an in-phase signal component, for example $s_{I1}(t)$ and/or a quadrature signal component, for example $s_{Q2}(t)$. Suitable combinations of the one or more baseband signals, for example $s_{I1}(t)+s_{I2}(t)$, may be modulated in a radio frequency transmission chain as illustrated in FIG. 3 and FIG. 4A that may comprise intermediate frequency modulation, for example onto a carrier at frequency $w_b$ and radio frequency modulation onto a carrier at frequency $w_a$. The suitable combinations of the one or more baseband signals may be weighted sums. The plurality of radio frequency signals may each carry distinct information, due to the different baseband signal combinations that may be carried. One of the plurality of radio frequency signals may be centered at a frequency f1+f2 and another one of said plurality of radio frequency signals may be centered at a frequency f1−f2, where f1 and f2 are frequencies. For example f1=$w_a$ and f2=$w_b$. The frequencies f1 and f2 may correspond to the radio frequency modulation and the intermediate frequency modulation, as illustrated in FIG. 4A. The plurality of radio frequency transmission signals may be frequency modulated signals, for example s(t).

In the radio frequency transmission chain, a plurality of intermediate frequency signal components, for example in the RF mixer 404 may be summed and perform the radio frequency modulation on the sum of the plurality of intermediate frequency signal components, for example in the RF mixer 406. In the radio frequency transmission chain, a plurality of radio frequency signal components may be summed to obtain the plurality of radio frequency transmission signals, for example at adder 434 in the RF mixer 406. The suitable combinations of the one or more baseband signals may be up-converted to radio frequency signals.

Another embodiment of the invention may provide a machine-readable storage, having stored thereon, a computer program having at least one code section executable by a machine, thereby causing the machine to perform the steps as described herein for transmitting multiple channels on FM bands.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a)

conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing communication signals, the method comprising:
   generating from one or more baseband signals, a plurality of radio frequency transmission signals each at a different radio frequency, wherein said one or more baseband signals comprise an in-phase signal component and/or a quadrature signal component; and
   modulating in a radio frequency transmission chain, combinations of said one or more baseband signal, to generate said plurality of radio frequency transmission signals, wherein said radio frequency transmission chain enables intermediate frequency modulation and radio frequency modulation.

2. The method according to claim 1, wherein said suitable combinations of said one or more baseband signals may be weighted sums.

3. The method according to claim 1, wherein said plurality of radio frequency signals each carry distinct information.

4. The method according to claim 1, wherein one of said plurality of radio frequency signals is centered at a frequency f1+f2 and another one of said plurality of radio frequency signals is centered at a frequency f1−f2, where f1 and f2 are frequencies.

5. The method according to claim 4, wherein said frequencies f1 and f2 correspond to said radio frequency modulation and said intermediate frequency modulation.

6. The method according to claim 1, wherein said plurality of radio frequency transmission signals are frequency modulated signals.

7. The method according to claim 1, comprising summing, in said radio frequency transmission chain, a plurality of intermediate frequency signal components and perform said radio frequency modulation on said sum of said plurality of intermediate frequency signal components.

8. The method according to claim 1, comprising summing, in said radio frequency transmission chain, a plurality of radio frequency signal components, to obtain said plurality of radio frequency transmission signals.

9. The method according to claim 1, comprising up-converting said suitable combinations of said one or more baseband signals to radio frequency signals.

10. A system for processing communication signals, the system comprising:
    one or more circuits, said one or more circuits enable:
    generation from one or more baseband signals, of a plurality of radio frequency transmission signals each at a different radio frequency, wherein said one or more baseband signals comprise an in-phase signal component and/or a quadrature signal component; and
    modulation in a radio frequency transmission chain, combinations of said one or more baseband signal, to generate said plurality of radio frequency transmission signals, wherein said radio frequency transmission chain enables intermediate frequency modulation and radio frequency modulation.

11. The system according to claim 10, wherein said suitable combinations of said one or more baseband signals may be weighted sums.

12. The system according to claim 10, wherein said plurality of radio frequency signals each carry distinct information.

13. The system according to claim 10, wherein one of said plurality of radio frequency signals is centered at a frequency f1+f2 and another one of said plurality of radio frequency signals is centered at a frequency f1−f2, where f1 and f2 are frequencies.

14. The system according to claim 13, wherein said frequencies f1 and f2 correspond to said radio frequency modulation and said intermediate frequency modulation.

15. The system according to claim 10, wherein said plurality of radio frequency transmission signals are frequency modulated signals.

16. The system according to claim 10, wherein said one or more circuits sum, in said radio frequency transmission chain, a plurality of intermediate frequency signal components and perform said radio frequency modulation on said sum of said plurality of intermediate frequency signal components.

17. The system according to claim 10, wherein said one or more circuits sum, in said radio frequency transmission chain, a plurality of radio frequency signal components, to obtain said plurality of radio frequency transmission signals.

18. The system according to claim 10, wherein said one or more circuits up-convert said suitable combinations of said one or more baseband signals to radio frequency signals.

* * * * *